United States Patent
Freundlich et al.

(10) Patent No.: US 9,431,556 B2
(45) Date of Patent: Aug. 30, 2016

(54) LONG WAVELENGTH INFRARED SENSOR MATERIALS AND METHOD OF SYNTHESIS THEREOF

(75) Inventors: Alexandre Freundlich, Houston, TX (US); Lekhnath Bhusal, Cupertino, CA (US)

(73) Assignee: THE UNIVERSITY OF HOUSTON SYSTEM, Houston, TX (US)

( * ) Notice: Subject to any disclaimer, the term of this patent is extended or adjusted under 35 U.S.C. 154(b) by 0 days.

(21) Appl. No.: 13/220,489

(22) Filed: Aug. 29, 2011

(65) Prior Publication Data

US 2012/0074462 A1   Mar. 29, 2012

Related U.S. Application Data

(60) Provisional application No. 61/378,069, filed on Aug. 30, 2010.

(51) Int. Cl.
| | | |
|---|---|---|
| *H01L 31/00* | (2006.01) | |
| *H01L 31/0304* | (2006.01) | |
| *H01L 31/109* | (2006.01) | |
| *H01L 31/18* | (2006.01) | |

(52) U.S. Cl.
CPC ....... *H01L 31/03048* (2013.01); *H01L 31/109* (2013.01); *H01L 31/1848* (2013.01); *Y02E 10/544* (2013.01); *Y02P 70/521* (2015.11)

(58) Field of Classification Search
CPC .............................. H01L 33/502; H01L 33/32
USPC .................... 257/14, 18, 184, 188, E31.022, 257/E31.015, E31.058
See application file for complete search history.

(56) References Cited

PUBLICATIONS

Kim et. al, "Optical Properties of Dilute Nitride InN(As)Sb Quantum Wells and Quantum Dots Grown by Molecular Beam Epitaxy," J. Electronic Mater., 37, 2008; pp. 1774-1779.*
Zhang et al., "The effects of growth parameters on the RF-MBE growth of dilute InNSb films," J. Phys. D: Appl. Phys. 43, 2010, 305405, pp. 1-6.*
Buckle et al., "Growth and characterization of dilute antimonide nitride materials for long-wavelength applications," Microelectronics Journal, 40, 2009, pp. 399-402.*
Young et al., "Bismuth surfactant growth of the dilute nitride GaNxAs1-x," J. Crystal Growth 279, 2005, pp. 316-320.*
Ashley et al., "Dilute Antimonide Nitrides for Very Long Wevelenght Infrared Applications," Proc. of SPIE vol. 6206, 62060L, (2006).*
Jin et al., "Epitaxial growth of high quality InSb1-xNx by MOCVD," 2008 IEEE, 2008, pp. 4-8).*
NPL search report.*
W.O. Groves, A. H. Herzog, and M. G. Craford, Appl. Phys. Lett. 19,184 (1971).
M. Kondow, K. Uomi, A. Niwa, T. Kitatani, S. Watahiki and Y. Yazawa, Jpn. J. Appl. Phys. 35, 1273 (1996).
M.-A. Pinault, A. Freundlich, J. A. H. Coaquira, and A. Fotkatzikis, J. Appl. Phys. 98, 023522 (2005).

(Continued)

*Primary Examiner* — Julia Slutsker
(74) *Attorney, Agent, or Firm* — Jackson Walker LLP

(57) ABSTRACT

A dilute nitrogen alloy of $InN_xSb_{1-x}$ epilayers strained to an epitaxial substrate useful for Long Wavelength Infrared (LWIR) Focal Plane Arrays, and method of fabricating. Strained materials of composition $InN_xSb_{1-x}$ exhibiting increased Auger lifetimes and improved absorption properties.

3 Claims, 16 Drawing Sheets

(56) References Cited

PUBLICATIONS

J. A. H. Coaquira, L. Bhusal, W. Zhu, A. Fotkatzikis, M-A Pinault, A.P. Litvinchuk, and A. Freundlich, Mater. Res. Soc. Symp. Proc. 829, B11.3,(2005).

J. A. H. Coaquira, M-A Pinault, A.P. Litvinchuk, L. Bhusal, and A. Freundlich, J. Appl. Phys (2007).

S. R. Kurtz, A. A. Allerman, E. D. Jones, J. M. Gee, J. J. Banas, and B. E. Hammons, Appl. Phys. Lett. 74, 729 (1999).

A. Wagner, C. Ellmers, F. Hohnsdorf, J. Koch, C. Agert, S. Leu, M. Hofmann, W. Stolz, and W. W. Ruhle, Appl. Phys. Lett. 76, 271 (2000).

E-M. Pavelescu, C.S. Peng, T. Jouhti, J. Konttinen, W. Li, M. Pessa, M. Dumitrescu and S. Spanulescu, Appl. Phys. Lett. 80, 3054 (2002).

W. Li, T. Jouhti, C. S. Peng, J. Konttinen, P. Laukkanen, E-M Pavelescu, M. Dumitrescu, and M. Pessa, Appl. Phys. Lett. 79, 3386 (2001).

L. Bhusal, A Alemu and A Freundlich, Phys. Rev. B 72, 073309, (2005).

A. Freundlich, A. Fotkatzikis, L. Bhusal, L. Williams, W. Zhu, A. Alemu, J.A.H. Coaquira, A. Feltrin and G. Radhakrishnan. J. Vac. Sci. Technol. B 25, 987 (2007).

W. Shan, W. Walukiewicz, J. W. Ager III, E. E. Haller, J. F. Geisz, D. J. Friedman, J. M. Olson, and S R. Kurtz, Phys. Rev. Lett. 82, 1221 (1999).

L. Bhusal and A. Freundlich, Phys. Rev. B 75, 073101 (2007).

L. Bhusal and A. Freundlich, J. Appl. Phys. 102, 074907 (2007).

T. D. Veal, I. Mahboob, and C. F. McConville, Phys. Rev. Lett. 92, 136801 (2004).

L. Bhusal and A. Freundlich, Appl. Surface Science 255, 703-705 (2008).

S. Tomic, E. P. O'Reilly, P. J. Klar, H. Gruning, W. Heimbrodt, W. M. Chen and I. A. Buyanova, Phys. Rev. B 69, 245305 (2004).

R.J. Elliot, Phys. Rev. 108, 1384 (1957).

A. Fotkatzikis, M.-A. Pinault, and A. Freundlich, Appl. Phys. Lett. 85, 2478 (2004).

\* cited by examiner

LONG WAVELENGTH INFRARED SENSOR MATERIALS AND METHOD OF SYNTHESIS THEREOF

CROSS-REFERENCES TO RELATED APPLICATIONS

This patent application claims priority to and the benefit of Provisional Patent Application Ser. No. 61/378,069 filed Aug. 30, 2010, entitled "Improved Long Wavelength Infrared Sensor Materials and Method of Synthesis Thereof," the entire content of which is hereby incorporated by reference.

FEDERALLY SPONSORED RESEARCH OR DEVELOPMENT

The U.S. Government has a paid-up license in this invention and the rights in limited circumstances to require the patent owners to license others on reasonable terms as provided for by the terms of Grant No. FA9550-07-1-0006 awarded by the US Air Force Research Laboratory.

FIELD

The present invention relates to a method and process of making of a new class of long wavelength infrared sensor materials that are particularly useful in Long Wavelength Infrared (LWIR) Focal Plane Arrays. More specifically, this invention discloses strained materials of composition of $InN_xSb_{1-x}$ that exhibit increased Auger lifetimes and improved absorption properties. Consequently, these materials are particularly well adapted to long-wavelength infrared devices that can operate at higher temperatures compared to existing devices, as well as other applications, such as but not limited to night vision, satellite military and civilian surveillance and infra-red imaging, intelligent manufacturing processing, medical imaging, and safety-related detection devices.

BACKGROUND

Infrared focal plane arrays operating in the 8-14 μm atmospheric window commonly referred to as long-wavelength IR (LWIR) detectors are a critical component in many of the military and civilian imaging systems. Since both quantum efficiency and detectivity depend upon the absorption and recombination lifetimes, an alternative to HgCdTe—like materials used in LWIR devices with stronger absorption coefficient and higher Auger recombination lifetimes is desirable as it allows the users to operate the device at higher temperatures.

Prior art teaches that a decrease in the band gap of Kane-like semiconductors generally yields to lower effective masses, hence affecting detrimentally both the absorption and Auger recombination coefficients.

It has been long known that small quantity of nitrogen in semiconductor materials like GaAs and GaP form a deep level impurity.[1] More recently, the unusual large band gap lowering observed in (In)GaAs1-xNx with low nitrogen fraction[2-6] has sparked a new interest in the development of dilute nitrogen containing III-V semiconductors for long-wavelength optoelectronic devices such as near IR lasers, detector, and solar cells.[3, 4-12] In spite of the decrease in the band gap, the conduction band effective mass has been predicted to rise with increasing nitrogen content, contrary to the expectation of usual k.p theory. The strong band gap bowing and increase in effective mass have been explained by a band anti-crossing model[13] considering the interaction of the localized nitrogen states with the extended states of the conduction band. Within the context of Ga(In)AsN alloys, significant enhancements of electron effective masses have been evidenced experimentally and has been directly correlated to the increase in exciton binding energies[5,6] and to the absorption strength in both bulk like and low dimensional heterosuctures.[11,12,14,15]

As for LWIR applications, the alloying of nitrogen (N) with InSb, a direct band gap III-V semiconductor material with a room temperature band gap of 0.17 eV (7.4 μm), has been ventured by several groups. A significant reduction of the bandgap with increasing N concentration has been experimentally evidenced for InNxSb1-x alloys and semi-metallic behavior has recently been reported[16] for alloys containing ~6% of nitrogen.

Theoretically, a band gap closure (Eg=0) has been predicted for bulk-like $InN_xSb_{1-x}$ containing x~2% of nitrogen.[17] Hence, dilute nitride $InN_xSb_{1-x}$ can be used for the far infrared detection devices for the wavelength regime of 7 μm and beyond. Higher effective masses in the dilute nitride III-V materials are expected to curb the Auger recombination in the device, hence increasing the sensitivity of the material as a detector.[17] Proper design of an infrared detector operating at a given temperature requires a detailed knowledge of the properties of the constituent semiconductor material.

The present invention described herein overcomes some well know barriers to existing materials used in infrared detection equipment by providing a method and process to design and fabricate improved long-wavelength infrared sensor materials. More specifically, the present invention discloses the use of dilute nitride alloys of $InN_xSb_{1-x}$ under biaxial tensile stress (i.e. pseudomorpically strained to InSb (001)) to significantly enhance the detectivity and the operation temperature of LWIR devices and to extract precise compositions necessary to realize such improvement. It also teaches the fabrication of epitaxial films with a method for the synthesis of the alloys.

SUMMARY

Conventional materials used in infrared detection equipment do not provide optimal detectivity or operation temperatures. The present invention comprises a long wavelength infrared sensor material with improved properties.

The present application discloses long wavelength infrared sensor material comprising a dilute nitrogen alloy of $InN_xSb_{1-x}$ epilayers strained to an epitaxial substrate. In certain embodiments, the epitaxial substrate is InSb (100). In one embodiment, the dilute nitrogen alloy may have a nitrogen composition in the range of about 0.2% to 1.5%, and the Auger recombination lifetime of the alloy material is higher than the Auger recombination lifetime of HgCdTe with identical cut-off wavelength.

The present invention further discloses a method for fabricating a dilute nitrogen alloy of $InN_xSb_{1-x}$ epilayers using molecular beam epitaxy.

The features and advantages of the present invention will be apparent to those skilled in the art. While numerous changes may be made by those skilled in the art, such changes are within the spirit of the invention.

DETAILED DESCRIPTION

Figure 1:
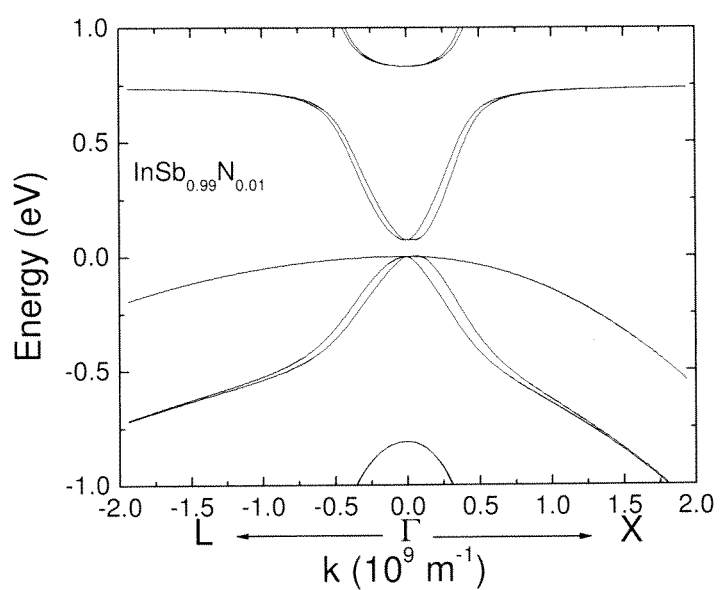
FIG. 1. Calculated electronic band structure of InNxSb1-x with 1% nitrogen using 10 bands k.p model.

The present invention relates to a method and process of making of a new class of long-wavelength infrared sensor materials that are particularly useful in Long Wavelength Infrared (LWIR) Focal Plane Arrays. More specifically, this invention discloses strained materials of composition of $InN_xSb_{1-x}$ that exhibit increased Auger lifetimes and improved absorption properties. Consequently, these materials are particularly well adapted to long-wavelength infrared devices that can operate at higher temperatures compared to existing devices, as well as other applications, such as, but not limited to night vision, satellite military and civilian surveillance and infra-red imaging, intelligent manufacturing processing, medical imaging, and safety-related detection devices.

Part I: Improved Properties of Strained Dilute Nitrogen Alloys of Indium Antimonide for LWIR Applications It should be noted that it is a common practice for InSb (001) substrates described in the embodiments of this invention to be intentionally (or accidentally) mis-oriented by several degrees toward another crystallographic direction (i.e. misoriented toward {110}, [111] . . . ). Such misorientation preserves the biaxial tensile nature of strain and the dominant physical behavior of a subsequently deposited $InSb_{1-x}N_x$ and hence the present invention is also applicable to such configurations. Hereafter the denomination of InSb (001) substrates assumes also configurations where the substrate is misoriented by several degrees toward {110} or {111} families of crystallographic directions. Furthermore, the application of a biaxial tensile (or uniaxial compressive strain) to $InSb_{1-x}N_x$ bulk-like or $InSb_{1-x}N_x$ epilayers by common mechanical and/or heteroepitaxial means for strain engineering, would also result in similar physical properties. It also should be noted that a partial substitution of In by small amount of Ga or/and Sb by small amounts of As could be adopted to further increase the strain magnitude and hence the conclusions drawn in this work are also applicable to these alloys. The embodiments of the invention disclosed herein thus are also applicable to all these configurations.

One embodiment of the present invention consists in theoretically assessing the use of dilute nitride alloys such as $InN_xSb_{1-x}$ strained to InSb for LWIR (long-wavelength infrared) applications. The combined effects of 1) the lattice mismatch strain, 2) the presence of highly localized nitrogen states, and 3) the coupling of the conduction/valence bands are used to extract the electronic band structure, the optical absorption and the evolution of Auger recombination lifetimes as a function of temperature for $InN_xSb_{1-x}/InSb(001)$. The sections that follow show that in fact an increase in Auger lifetime and absorption properties are observed for $InN_xSb_{1-x}$ (compared to InSb) and also demonstrate the potential for significantly increasing the operating temperature of $InN_xSb_{1-x}$ compared to the existing ones (such as Kane-like semiconductors like HgCdTe for example) over existing long-wavelength infrared devices.

I-1 Evolution of Biaxially Strained $InN_xSb_{1-x}$ Bandgap

An embodiment of the present invention discloses a method to calculate the electronic band structure of $InN_xSb_{1-x}$ with 1% nitrogen using 10 bands k.p model. InSb is a direct band semiconductor whose conduction band minimum and valance band maximum are located at k=0. Using the 10-band k.p model,[18] which includes the localized nitrogen band interaction with the conduction band, and the coupling between valence and conduction band, the band structure of the $InN_xSb_{1-x}$ is calculated as shown in FIG. 1.

Figure 2:
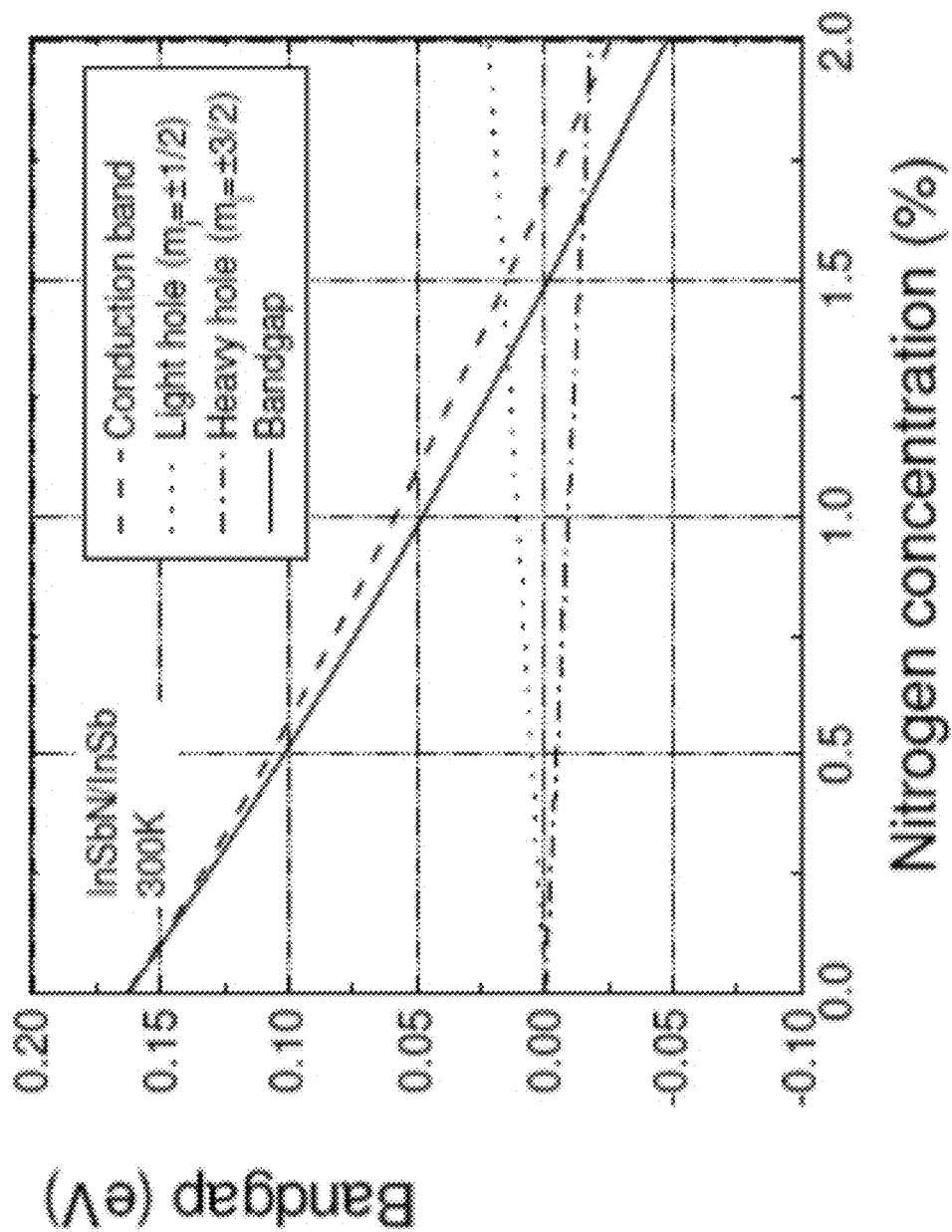
FIG. 2. Variation of the conduction and valence ($m_j=\pm 1/2$ and $m_j=\pm 3/2$) bands at k=0 for different nitrogen concentration in $InN_xSb_{1-x}$ when strained to InSb (001) substrate. Band gap closure at nitrogen concentration of 1.5% can be noted.

Another embodiment of the present invention discloses the effect of nitrogen (N) concentration on the conduction and valence ($m_j=\pm 1/2$ and $m_j=+3/2$) bands at k=0 in $InN_xSb_{1-x}$ when strained to InSb (001) substrate. When strained to InSb (001) (a commonly used substrate for the epitaxial synthesis of these alloys), and because of the difference in the lattice constants relative to InSb, the $InN_xSb_{1-x}$ (001) are subjected to a (001) biaxial tensile strain whose magnitude is proportional to the amount of substitutional nitrogen (Nitrogen in Sb site). Hereafter the nitrogen composition x in $InN_xSb_{1-x}$ alloys refers to that of the substitutional nitrogen composition in the alloy. FIG. 2 shows the band edges of the conduction band and of the two valence bands at k=0 for different nitrogen (N) concentrations in $InN_xSb_{1-x}$ when it is psudomorphically strained to InSb substrate. The band gap closure can be noted at the nitrogen concentrations of about 1.5%. This value is lower than the 2% of nitrogen concentration needed for the band gap closure for unstrained $InN_xSb_{1-x}$.[17] A split of two valence subbands, (with $m_j=\pm 1/2$ and $m_j=\pm 3/2$ spin momentums) can be noticed as $InN_xSb_{1-x}$ is strained to InSb (001). This split increases as the nitrogen concentration increases due to the increased amount of strain.

Figure 3:
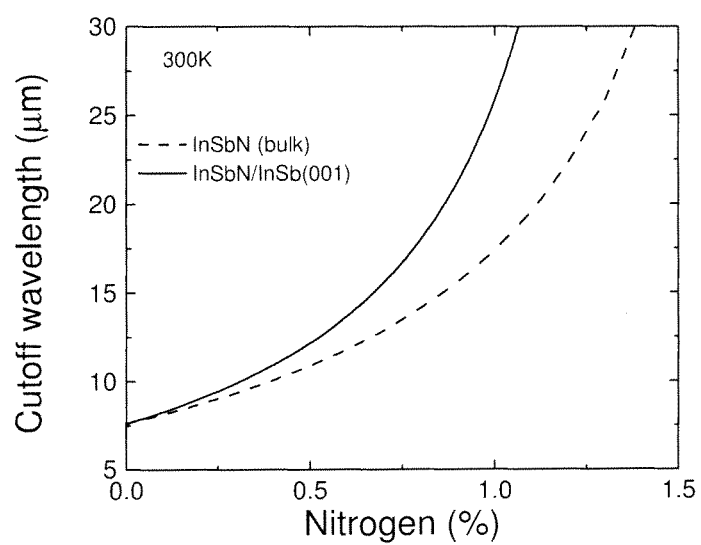
FIG. 3. Cutoff wavelength of $InN_xSb_{1-x}$ strained to InSb (001) substrate (solid curve) and unstrained $InN_xSb_{1-x}$ (dashed curve extracted from reference 17) at 300K.

Another embodiment of the present invention discloses the value of the cutoff wavelength of InNxSb1-x strained to InSb(001) substrate compared to that of the unstrained InNxSb1-x as a function of nitrogen concentration and at a temperature of 300K. FIG. 3 shows that room temperature cutoff wavelengths ($\lambda_{cutoff}(\mu m)=1.2398/E_g(eV)$) for $InN_xSb_{1-x}$ strained to InSb (001) substrate and bulk-like unstrained $InN_xSb_{1-x}$ of 25 μm can be achieved for nitrogen concentration of ~1%.

I-2 Effective Mass Enhancement in $InN_xSb_{1-x}$

Another embodiment of the present invention discloses the effect of nitrogen concentration on the effective masses of carriers (in the conduction band) in $InN_xSb_{1-x}$. Carrier effective masses play an important role in many aspects of the device performance. It affects the absorption, recombination and transport of the carriers under different conditions. The incorporation of nitrogen in InSb increases the effective mass of the electrons given by the analytical formula derived from the band anti-crossing[13, 14] as $$m^* = m_{m-v}\left[1 + \frac{yV_N^2}{(E_N - E_-)^2}\right] \quad (1)$$

where $$E_-(k)=1/2\{E_N+E_{III-V}(k)+\in_{xx}-\sqrt{(E_N-E_{III-V}(k)-\in_{xx})^2+4yV_N^2}\}, \quad (2)$$

Figure 4:
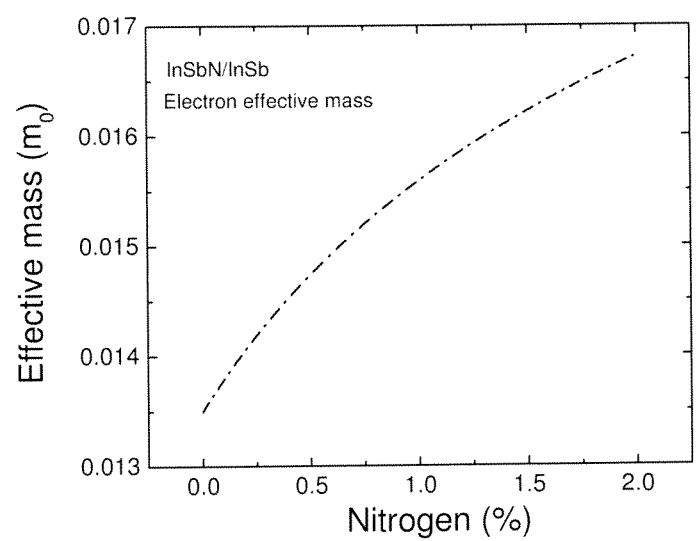
FIG. 4. Variation of the effective masses of carriers in conduction band due to the nitrogen and strain related effects.

$E_N$ is the energy of the localized nitrogen state, $E_{III-V}(k)$ is the dispersion of the host crystal conduction band, $V_N$ is the strength of the anti-crossing interaction between the N-localized states and the conduction band states of host matrix, $\in_{xx}$ is a biaxial strain and y is the nitrogen concentration. FIG. 4 shows the increase in the electron effective mass due to the nitrogen concentration and strain-related effects as nitrogen concentration increases. The effect of the increase in the effective masses on the optical and recombination properties of the material is discussed in following embodiments.

1-3 Long Wavelength Absorption Properties of $InN_xSb_{1-x}$

Another embodiment of the present invention discloses the optical absorption coefficient parameters for $InN_xSb_{1-x}$ as a function of nitrogen concentration. The optical absorption coefficient is an important parameter for applications of such material in optical devices. Elliot-like formula[19] has been used to find the absorption coefficients of the dilute nitride InSb bulk materials, which gives the total absorption due to both the bound and the continuum states in a bulk semiconductor as $$\alpha(\hbar\omega) = \frac{A_0}{2\pi^2 R_y a_0^3}\left[4\sum_{n=1}^{\infty}\frac{\Lambda}{\left(\Xi + \frac{1}{n^2}\right)+\Lambda^2}\frac{1}{n^3} + \frac{\pi e^{\frac{\pi}{\sqrt{\Xi}}}}{\sinh\left(\frac{\pi}{\sqrt{\Xi}}\right)}\right], \quad (3)$$

where $\frac{\alpha(\hbar\omega) - E_g}{R_y}$, $A_0 = \frac{\pi e^2 |\hat{i}\cdot p_{cv}|^2}{n_r c \varepsilon_0 m_0^2 \omega}$, $R_y = \frac{1}{(4\pi\varepsilon_s)^2}\frac{\mu_r e^4}{2\hbar^2}$, $a_0 = \frac{4\pi\varepsilon\hbar^2}{e^2\mu_r}$, $\mu_r$ is the reduced effective mass of the holes and the electrons given as, $$\frac{1}{\mu_r} = \frac{1}{m_e} + \frac{1}{m_h};$$

Figure 5:
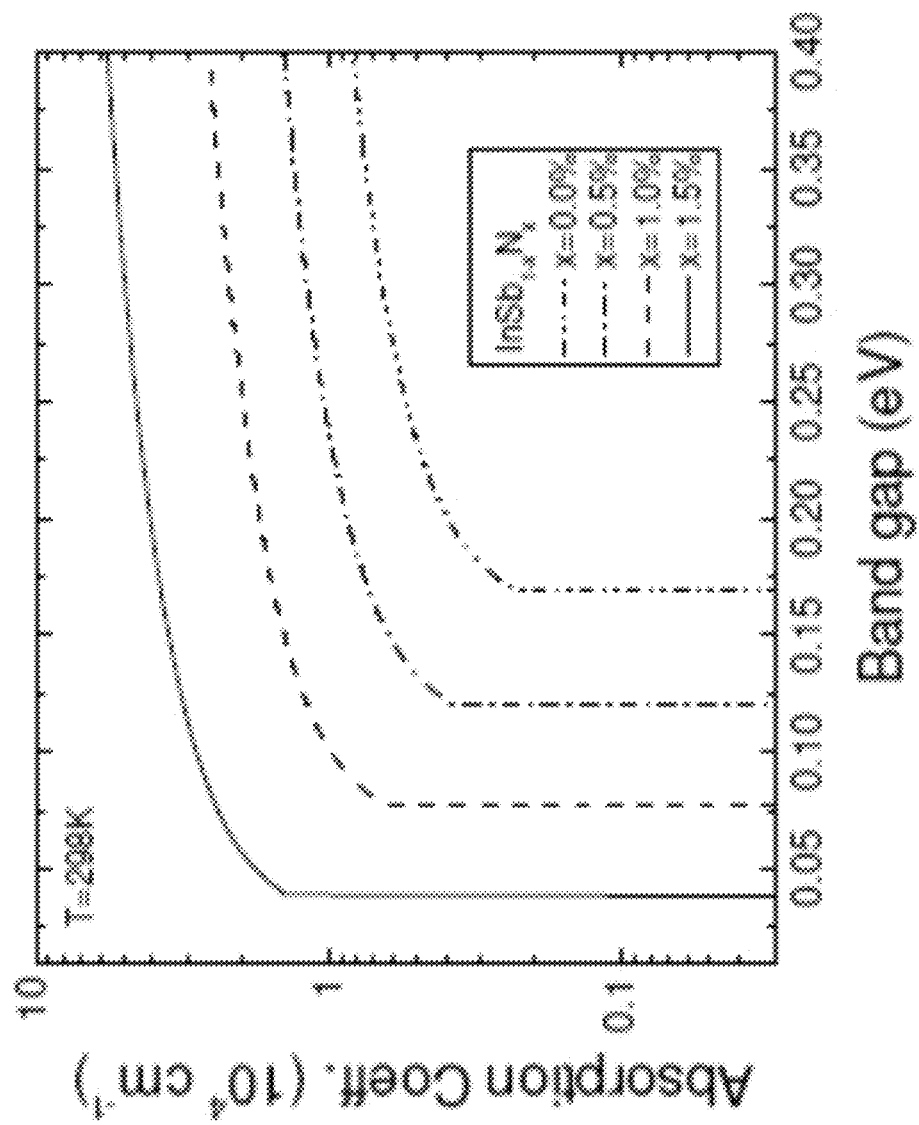
FIG. 5. Absorption coefficients of $InN_xSb_{1-x}$ for different nitrogen concentrations at 298K.

$\in_s=K\in_0$, and K is the dielectric constant, $E_g$ is the band gap of the material, c is the speed of light, $m_0$ is the mass of an electron, e is an electronic charge, ω is angular frequency and pcv is a momentum matrix element between the conduction and valence bands. A higher carrier effective mass in the dilute nitrides suggests an increase in the absorption, and such effect is visible in FIG. 5. FIG. 5 shows the change in the absorption coefficient of $InN_xSb_{1-x}$ at various nitrogen concentrations. An increase in the absorption, along with a decrease in the absorption-band-edge are noticed as the nitrogen concentration is increased.

Figure 6:
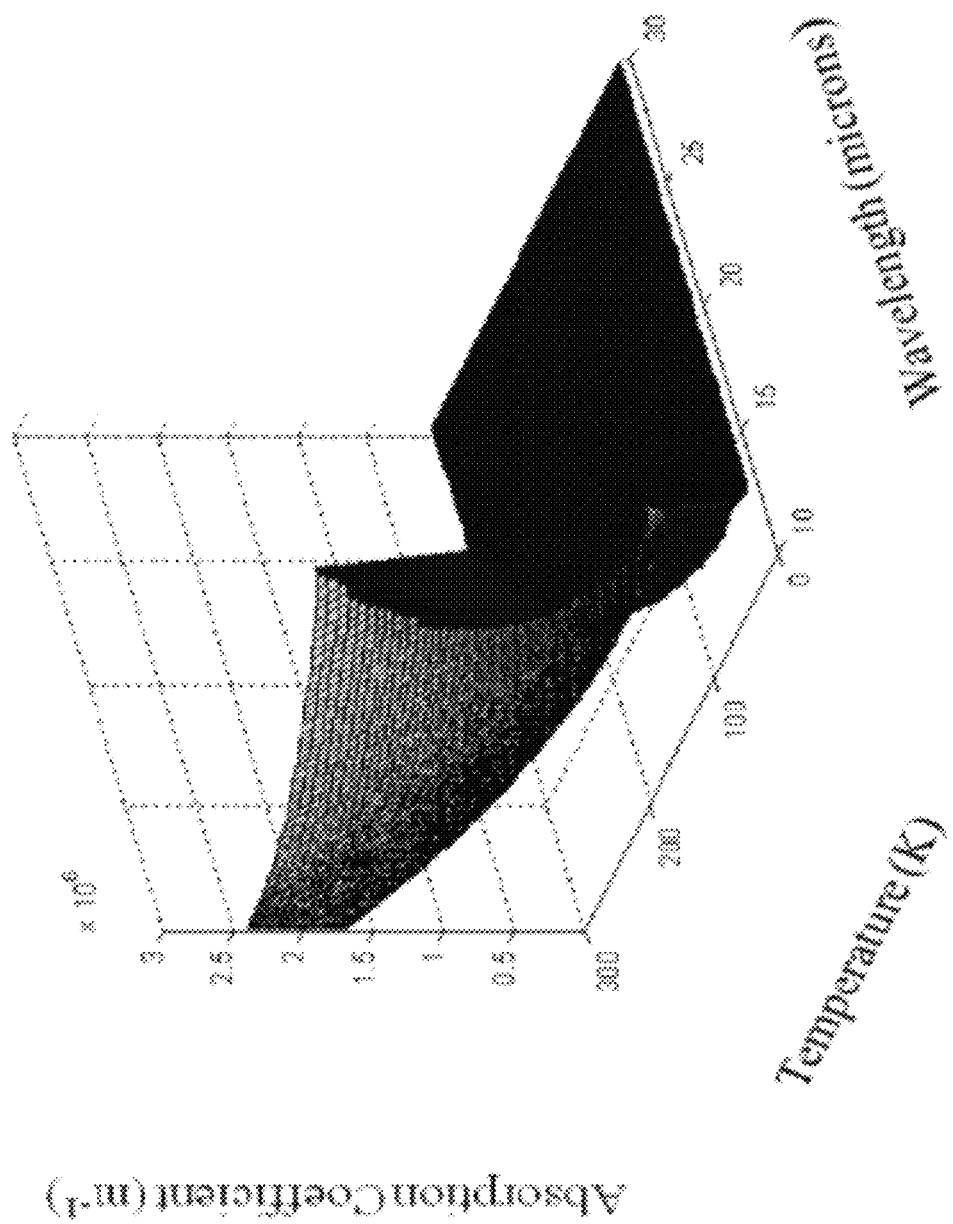
FIG. 6. Example of evolution of the absorption coefficient and the cut-off wavelength (bandgap) of biaxially strained $InSb_{0.99}N_{01}$ as a function of temperature.

Another embodiment of the present invention teaches that the absorption and cutoff wavelengths of devices or materials that are made with $InN_xSb_{1-x}$ can be tuned by varying their operation temperature, and that such tuning can be achieved at any x (nitrogen concentration) value. FIG. 6 provides an example of the evolution of the absorption coefficient and cut-off wavelength for an $InSb_{0.99}N_{0.01}$ (N composition x~0.01) as a function of the temperature.

Figure 7:
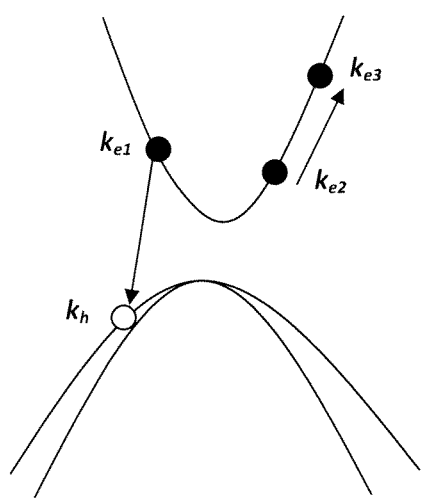
FIG. 7. Schematic representation of CCCH Auger mechanism. The electron in state $k_{e1}$ for conduction band state) recombines to the hole in state $k_h$ (H, for heavy-hole band state), and the energy in the process transfers the electron in the state $k_{e2}$ (C) to the state $k_{e3}$ (C), without the generation of photon.

I-4 Enhancement of Auger Recombination Lifetimes and Implications for Infrared Detection Another embodiment of the present invention discloses the schematic representation of CCCH Auger mechanism in InSb-like semiconductors where the electron in state $k_{e1}$ (C, for conduction band state) recombines to the hole in state $k_h$ (H, for heavy hole band state), and the energy in the process transfers the electron in the state $k_{e2}$ (C) to the state $k_{e3}$ (C), without the generation of photon. Electrons and holes in a semiconductor can recombine radiatively or nonradiativly. Non radiative mechanism mainly includes recombination at defects, surface recombination and Auger recombination. Auger recombination is a dominant non-radiative process in the low bandgap semiconductors or semiconductors with very high concentrations of free carriers, which otherwise could be ignored in high bandgap materials. The Auger recombination involves four particle states (for example, three electrons and one hole states, two electrons and two holes states, etc.) and includes three particle types, hence, scales as third power of the carrier density. In this process, the energy released during the electron-hole recombination is transferred to another electron (or hole), which gets excited to a higher energy state in the band. This electron or hole then relaxes back to achieve thermal equilibrium by losing its energy to lattice vibration (phonons). The band-to-band Auger recombination processes in InSb-like semiconductor can be classified in many photon-less mechanisms. Two of them have the smallest threshold energy, hence are most probable and are denoted by CCCH (or CCCL) and CHHL, where C stands for a state in the conduction band, a state H for heavy-hole valance band and L for a state light-hole valence band. In CCCH process, for example, an electron in conduction band (say, in state $k_{e1}$, as illustrated in FIG. 7) recombines with a hole in valence band (state $k_h$), and the energy gained is taken up by exciting another electron from the state $k_{e2}$ to $k_{e3}$. Hence, there is an involvement of three states in conduction band (CCC) and one state in the hole band (H). Same interpretation can be given to the other nomenclatures.

Another embodiment of the present invention discloses the effect of Auger recombination time on the cutoff wavelength and at various nitrogen concentrations for intrinsic $InN_xSb_{1-x}$ strained to InSb and for $InN_xSb_{1-x}$ tensilely strained to InSb(001).

Figure 8:
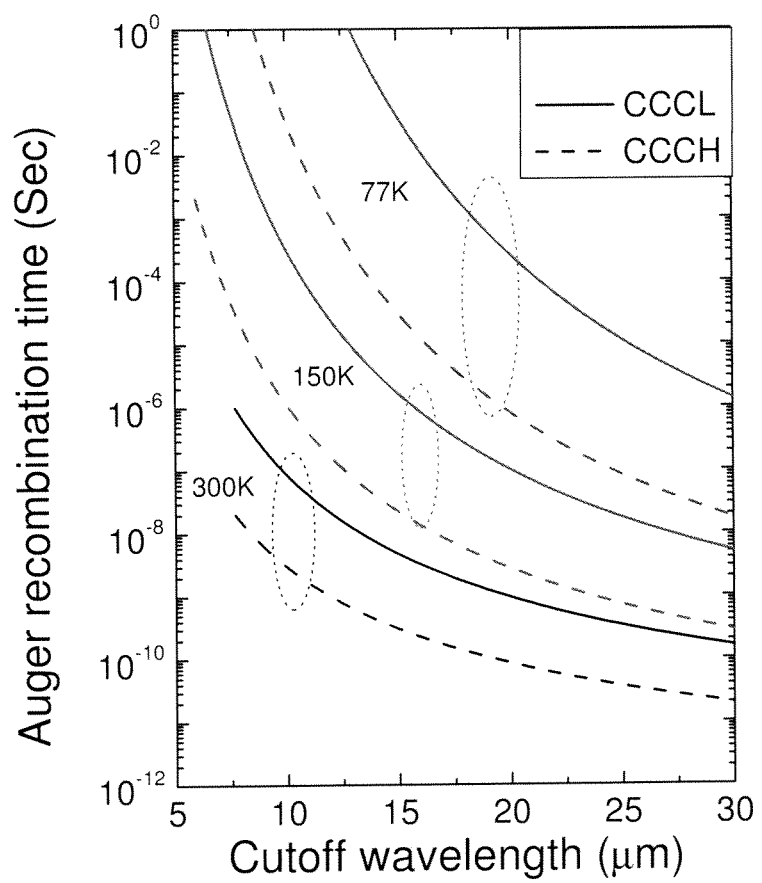
FIG. 8. Auger recombination time for the intrinsic $InN_xSb_{1-x}$ strained to InSb (001) at various nitrogen concentrations producing different cutoff wavelengths. Recombination involving conduction and heavy hole bands, and conduction and light hole bands at various temperatures are shown.

Recombination involving conduction and heavy hole bands, and conduction and light hole bands at different temperatures is shown in FIG. 8. For $InN_xSb_{1-x}$ tensilely strained on InSb (001), the light hole bands (spin momentum $m_j$ move higher than the heavy hole bands, hence the threshold energy is smaller for the mechanisms CCCL involving the light hole bands in comparison to the mechanism CCCH. Since the spin-orbit-split-off band of InSb is almost four times larger than the band gap, the Auger mechanism involving the spin orbit split off band can be neglected reasonably. In this work we dwell with the Auger process CCCH for bulk-like unstrained $InN_xSb_{1-x}$ and CCCL for $InN_xSb_{1-x}$ strained to InSb (001). The expression for the Auger lifetime in the non-degenerate approximation for CCCH (or CCCL) process is given as[20]

$$\tau_{CCCH(L)} = \frac{h^3 \varepsilon_0^2}{\sqrt{8\pi} \, q^4 m_0} \frac{\varepsilon^2 \sqrt{(1+\mu)} \, (1+2\mu)}{(m_e/m_0)|F_1F_2|^2 (kT/E_g)^{\frac{3}{2}}} e^{\frac{(1+2\mu)E_g}{(1+\mu)kT}} \quad (6)$$

where $\mu$ is the ratio of the conduction and heavy-hole band (or light hole band) effective masses, $\in$ is the static frequency dielectric constant, $|F_1F_2|$ is the overlap integral of the periodic part of the electron wave function, h is a Planck's constant, $m_0$ is the electron mass, $m_e$ is the electron effective mass and $E_g$ is the band gap.

When $InN_xSb_{1-x}$ is tensilely strained on InSb(001), the light hole band moves up closer to the conduction band, hence the CCCL Auger mechanism may become predominant and is thus more important to consider for the device application based on $InNxSb_{1-x}$/InSb. FIG. 8 shows the variation of most probable band-to-band Auger mechanism CCCL and CCCH for the strained $InN_xSb_{1-x}$ layers. Reduced transition time for the recombination through the channel CCCL can be noted in comparison to the channel CCCH. This is particularly advantageous for the tensilely strained material, for instance $InN_xSb_{1-x}$ on InSb, due to the possibility of reducing the carrier loss through the nonradiative recombination. FIG. 8 also presents the calculated recombination lifetimes for different temperatures.

Figure 9:
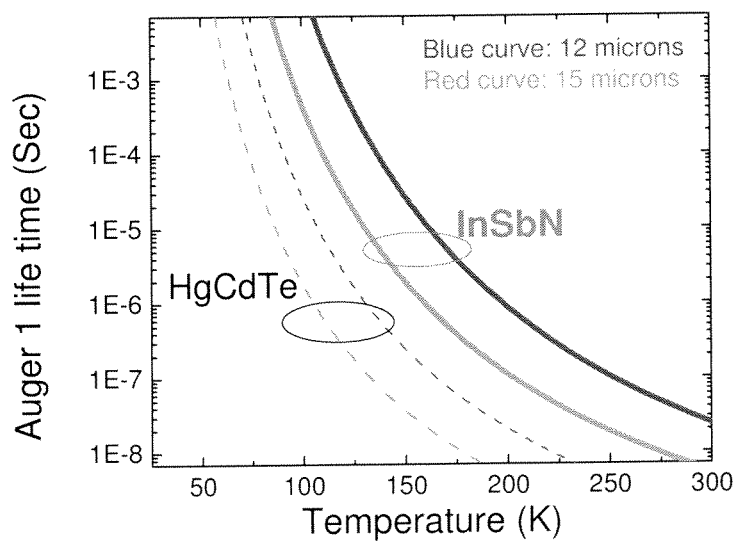
FIG. 9. Auger recombination time variation for $InN_xSb_{1-x}$ (solid lines) where the nitrogen composition has been adjusted to yield cutoff wavelength of 12 μm (blue) and 15 μm (red). Comparison to Auger recombination lifetimes obtained in HgCdTe with similar cutoff wavelengths are shown (dashed lines). Higher Auger recombination lifetime is noted with tensilely InNxSb1-x compared to to HgCdTe of same band gap.

Another embodiment of the present invention discloses the effect of the temperature on the Auger recombination time in strained $InN_xSb_{1-x}$ and compares it to its conventional counterpart, which is HgCdTe. The higher recombination time for the recombination through the CCCL mechanism should favor the use of devices at higher temperatures, in comparison to the devices where the recombination through the CCCH is prevalent. Hence materials based on tensilely strained $InN_xSb_{1-x}$ are advantageous (over bulk-like $InN_xSb_{1-x}$ and any Kane-like semiconductors) to use in devices as the increased Auger lifetime significantly reduces carrier recombination losses, which is an attribute critical to increasing the signal to noise ratio in photodetectors. At higher temperatures the Auger recombination lifetime decreases, which as mentioned earlier is a factor often limiting the operation temperature of IR devices. However the recombination lifetimes for similar wavelengths and temperatures appear to be much higher in $InN_xSb_{1-x}$ that is tensilely strained on InSb(001) than those obtained in Kane-like semiconductors. A comparative example of the evolution of Auger lifetimes for a cutoff wavelength of 15 μm $InN_xSb_{1-x}$ strained to InSb(001) and that of 15 μm HgCdTe, a material commonly used for MWIR and LWIR application, are presented in FIG. 9 showing the potential of $InN_xSb_{1-x}$ to significantly increase the operation temperature of long wavelength infrared detectors. Similar behavior is also predicted for materials made of $InN_xSb_{1-x}$ strained alloys with shorter and longer cutoff wavelengths.

I-5 Conclusions

Absorption and recombination properties of bulk-like and dilute nitride $InN_xSb_{1-x}$ alloys and films pseudomorphically strained to InSb (100) have been investigated within the framework of a ten band k p theory. The lowering of the bandgap with increasing nitrogen concentration is accompanied by an unusual enhancement of electron effective masses that yields to significantly stronger absorption coefficients than those predicted for Kane-like semiconductors (i.e. HgCdTe). The enhancement of the absorption coefficient in materials made of $InN_xSb_{1-x}$ strained on InSb is also accompanied by an increase of non-radiative recombination time due to both the combined effect of electron mass increase and the splitting of the valence band light and heavy hole states. In particular, the proximity of light holes (spin momentum $m_j=\pm 1/2$) to the conduction band in tensilely strained $InN_xSb_{1-x}$ causes the CCCL Auger process to prevail over the CCCH process (commonly observed in bulk-like semiconductors), leading to markedly larger recombination lifetimes (a desirable attribute). A study of the temperature dependence of the recombination lifetimes combined with absorption properties shows that dilute nitride $InN_xSb_{1-x}$ alloys under biaxial tensile stress significantly outperform commonly used HgCdTe as well as bulk-like $InN_xSb_{1-x}$[18] alloys in long-wavelength (8-20 μm) infrared detector applications. It should be noted that in practice one may use the principle of strain balancing i.e by alternating layers of the proposed tensilely strained $InN_xSb_{1-x}$ with compressively strained layers of $InBi_xSb_{1-x}$ or $InN_xBi_ySb_{1-x-y}$. One embodiment of the invention includes $InN_xSb_{1-x}$ wherein the Sb atoms have been partially substituted by Bi.

Part II: Method of Fabrication of Epitaxialy Strained Dilute Nitrogen Alloys of Indium Antimonide Films and Experimental Validation of Infrared Properties It should be noted, as mentioned above, that it is a common practice for InSb (001) substrates described in the embodiments of the present invention to be intentionally (or accidentally) mis-oriented by several degrees toward another crystallographic direction (i.e misoriented toward {110}, [111], ... ). Such misorientation preserves the biaxial tensile nature of strain and the dominant physical behavior of a subsequently deposited $InN_xSb_{1-x}$ and hence the method of fabrication that is discussed hereafter is also applicable to such configurations and could be adapted by one skilled in the epitaxial art to fabricate the said biaxially strained films of $InN_xSb_{1-x}$ on other common epitaxial substrates (i.e Si, Ge, sapphire, GaAs, InP, InAs, CdTe, GaSb).

Another embodiment of the present invention discloses a method and process for the fabrication of a new class of long wavelength infrared sensors materials that are particularly useful in homeland security and surveillance, military vision and guidance, satellite IR imaging, quantum imaging and cryptography, and pulsed power capacitors for medical use and medical LWIR imaging.

Another embodiment of the present invention discloses the high resolution X-ray diffraction rocking curves for $InSb_{1-x}N_x$ grown on InSb(001). The growth of dilute nitrogen alloys of InSb epilayers is undertaken using nitrogen-plasma assisted molecular beam epitaxy (MBE) on (001) InSb substrates using a Riber MBE 32P system. An indium conventional effusion cell provides the In flux, while the Sb flux is generated by an Sb craker cell. Typical In and Sb fluxes are measured through the growth process using an ion gauge. The optimal ratio of Sb versus In flux is found to be optimal in the 1 to 2 range, or the 1.2 to 1.6 range. The In source temperature is adjusted to yield InSb growth rate of about 0.2 to 2 microns per hour, or 0.5 to 1.5 microns per hours, or 0.8-1 microns per hour. Nitrogen is introduced in the system using an rf-plasma epi™ source. Following the oxide desorption (~515-520° C.) the substrate temperature is lowered to about 420° C. and for all samples a thin (0.1-0.2 micron) InSb buffer is deposited with In and Sb flux ratio and growth rates as described above.

Figure 10:
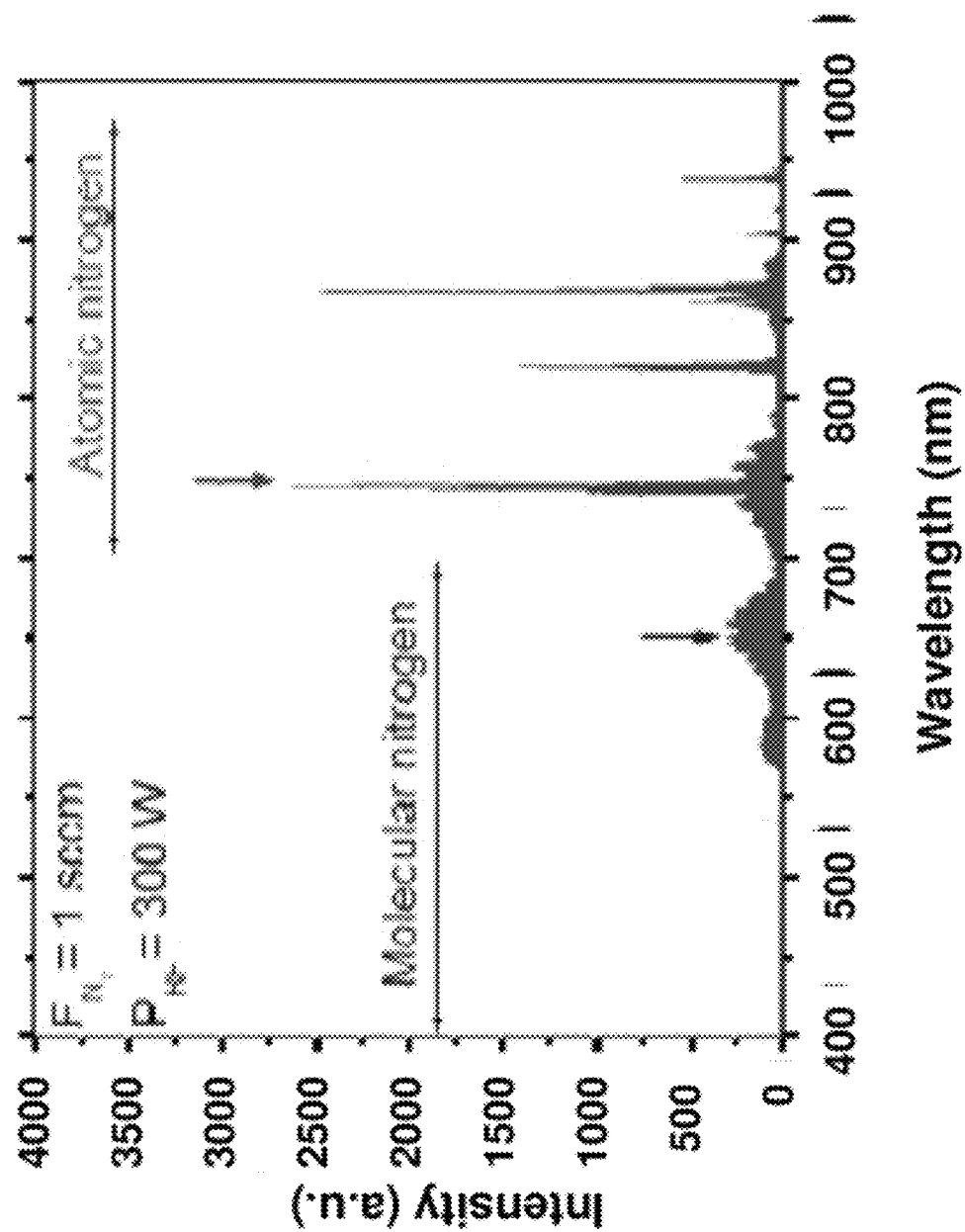
FIG. 10. Typical nitrogen plasma source spectra recorded during MBE growth, for a plasma power of 300 W and a nitrogen flow of 1 sccm. Arrows indicate the intensity of nitrogen lines used to measure N-atomic and molecular ($N_2$) species ratios.

The growth of $InN_xSb_{1-x}$ alloy is investigated as a function of growth temperature (350-450° C.), the nitrogen flow, and the plasma power conditions. The nitrogen plasma characteristics and their change are monitored by recording the plasma emission spectrum through a viewport installed at the back of the rf plasma source during nitrogen plasma flux stabilization and the growth of epilayers. The analysis experimental setup is similar to that previously reported in the literature.[21] A typical nitrogen plasma spectra recorded during the growth of $InN_xSb_{1-x}$ alloys on InSb(001) is illustrated in FIG. 10, and reveals the presence of both atomic and molecular nitrogen species.

Figure 11:
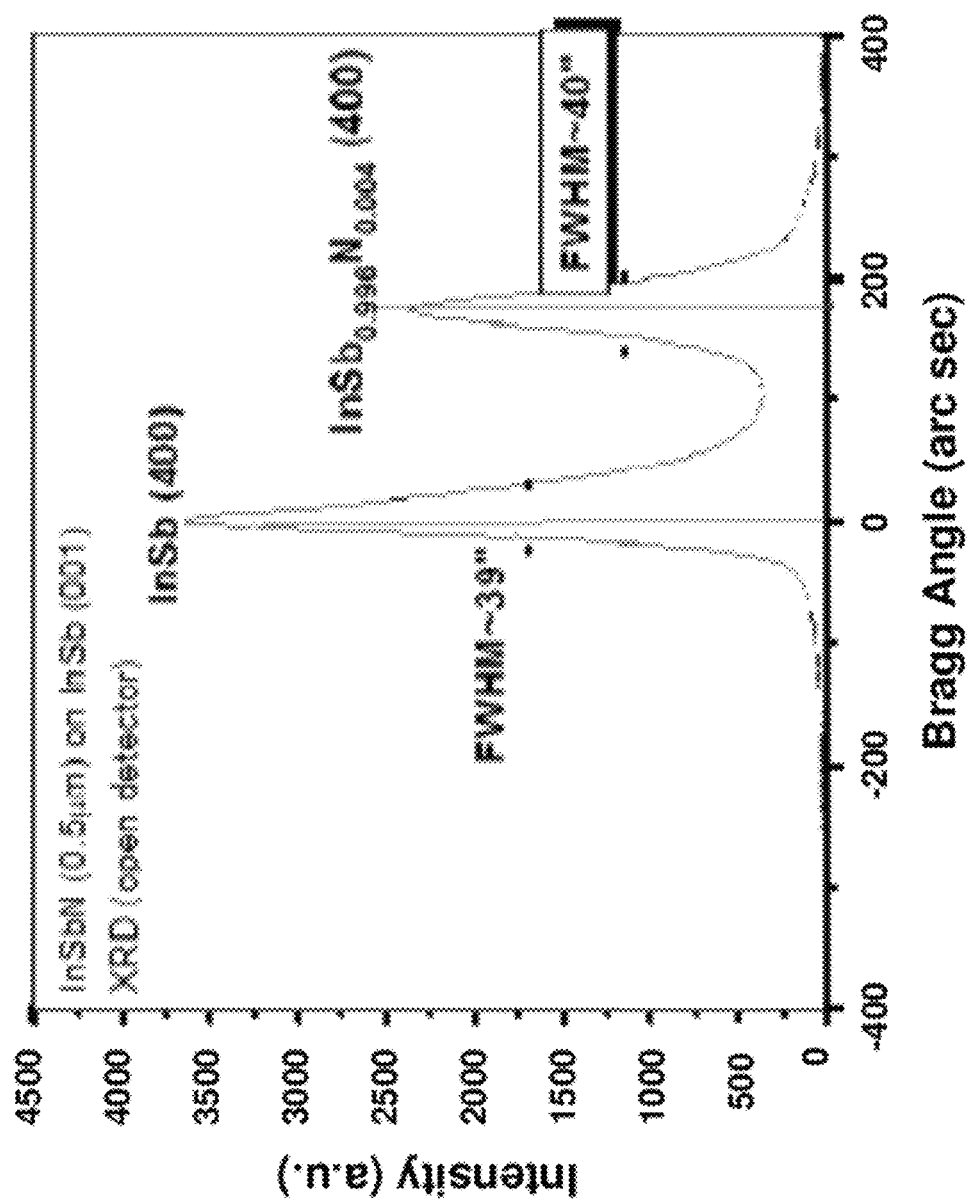
FIG. 11. High resolution X-ray diffraction rocking curve recorded on a 0.5 micron thick $InSb_{1-x}N_x$ (x~0.4%) grown on InSb(001) at a growth rate of 0.8 microns per hour.

The resulting nitrogen composition in the grown epilayers is extracted using high resolution X-ray diffraction. FIG. 11 depicts a typical XRD spectrum of a pseudomorphically strained $InN_xSb_{1-x}$ film grown on InSb(001) at a substrate temperature of 420° C. and at a rate of 0.8 microns per hour, and with a In/Sb partial pressure ratio of 1.2, a plasma power of 300 W, and a flux of 0.5 sccm.

II-1 Effect of N-Plasma Power on N Incorporation in $InN_xSb_{1-x}$.

Figure 12:
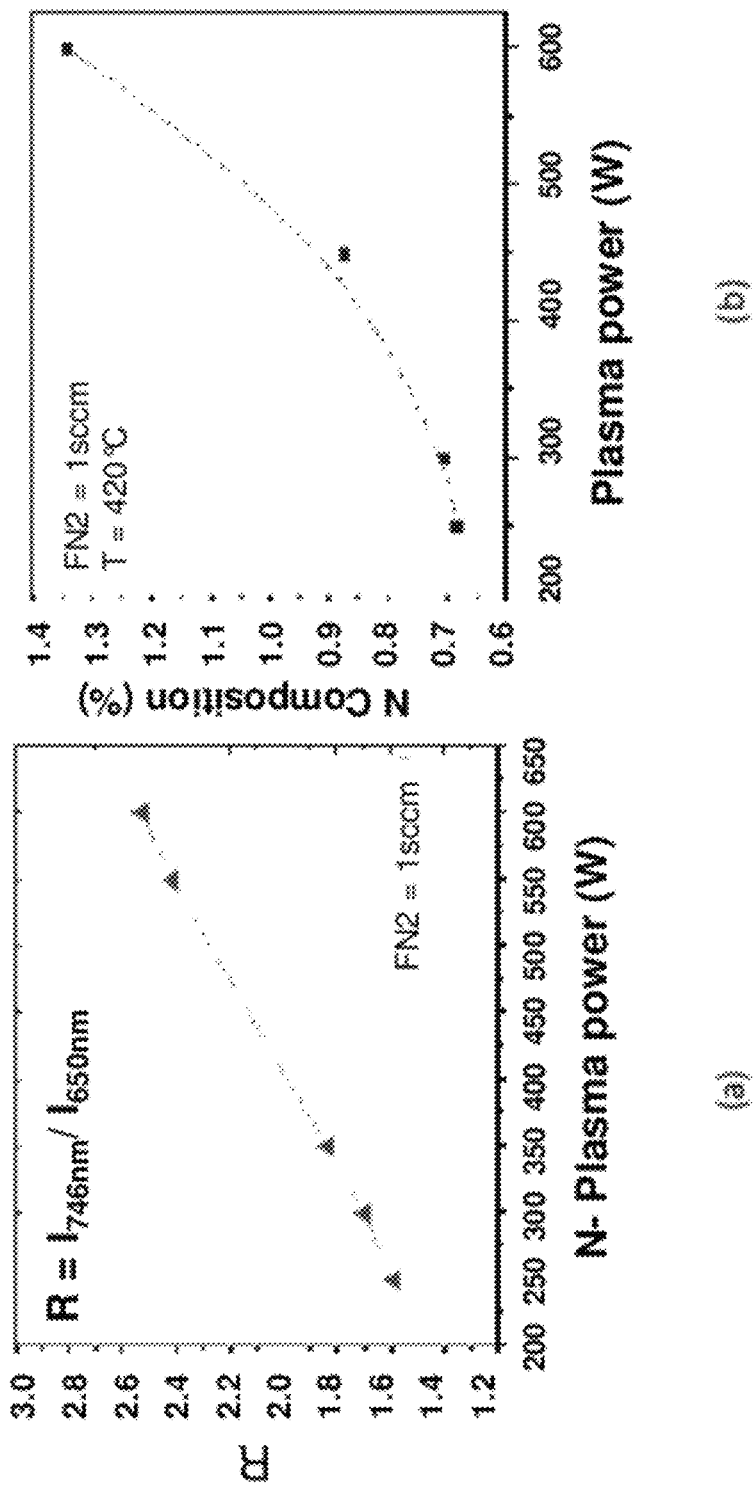
FIG. 12: (a) Evolution of the ratio of the line at 746 nm (corresponding to atomic nitrogen) and the line at 650 nm (corresponding to molecular nitrogen) in the plasma spectrum during growth. (b) Evolution of nitrogen composition in InSb1-xNx grown at 420° C. as a function of N plasma source power.

Another embodiment of the present invention discloses the effect of nitrogen plasma power on the incorporation of nitrogen in InSb and on the ration (R) of the spectrum line at 746 nm (corresponding to atomic nitrogen) over the spectrum line at 650 nm (corresponding to molecular nitrogen) in the plasma spectrum during growth. While the composition of nitrogen in $InN_xSb_{1-x}$ is found to linearly increase with the nitrogen flux, the increase of N composition as a function of the nitrogen plasma source power (and ratio of atomic/molecular N species) is somewhat non-linear. FIG. 12 (a) shows the evolution of nitrogen atomic vs. molecular N species as a function of nitrogen plasma source power. The nitrogen composition in strained epilayers fabricated by MBE as a function of the plasma power is shown in FIG. 12(b).

II-2 Effect of Growth Temperature on N Incorporation in $InN_xSb_{1-x}$ and Surface Characteristics.

Figure 13:
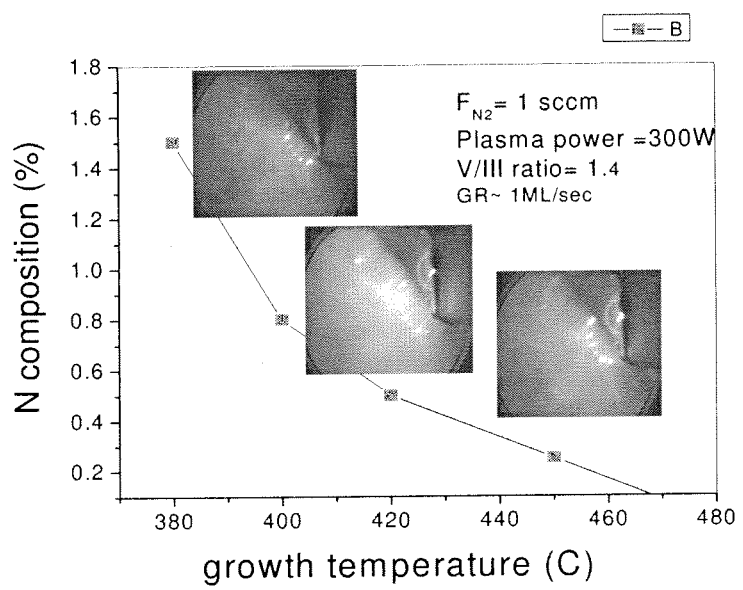
FIG. 13: Evolution of the substitutional nitrogen composition in InSb1-xNx as a function of growth temperature.

Another embodiment of the present invention discloses the effect of substrate growth temperature on the substitutional nitrogen concentration in $InN_xSb_{1-x}$. To evaluate the effect of substrate growth temperature on the nitrogen incorporation, a set of $InN_xSb_{1-x}$ epilayers are deposited using identical growth parameters at temperatures ranging from 380 to 450° C. In other embodiments, substrate growth temperature ranges from 400° C. to 440° C., or 410° C. to 430° C. All samples exhibit a two dimensional RHEED attesting of the high quality of the fabricated samples. FIG. 13 shows that an increase in the substrate growth temperature leads to a decrease in the amount of nitrogen that is being incorporated in InSb.

Figure 14:
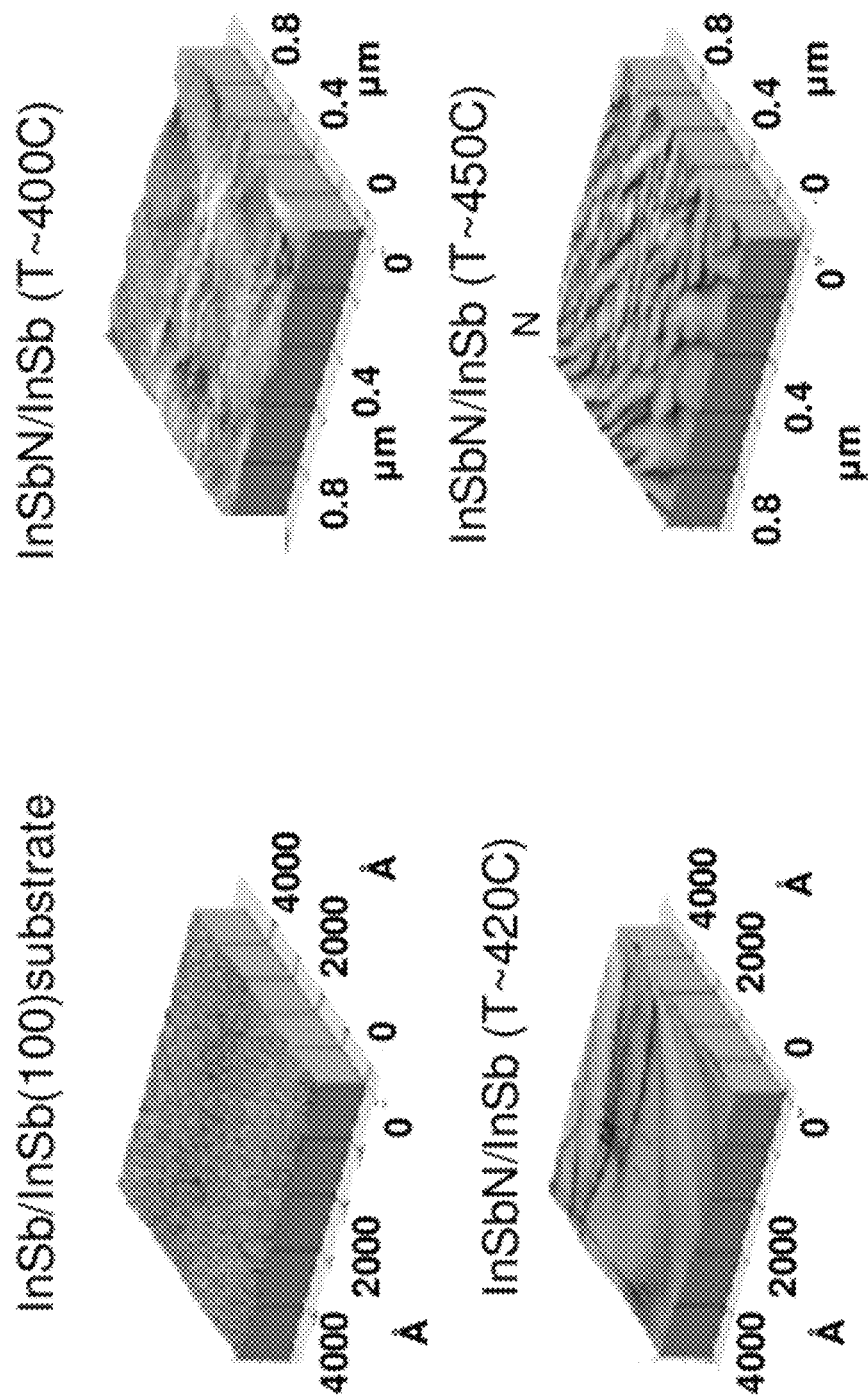
FIG. 14: AFM analysis of InNxSb1-x samples fabricated at different growth temperatures.

Under optimal growth conditions, $InN_xSb_{1-x}$ growth yielded a 2D (2×1) RHEED diagram. Samples with $InN_xSb_{1-x}$ thickness ranging from 0.2 to 1 micron and a nitrogen composition in the alloys ranging from 0.2 to 1.5% are fabricated. X-ray diffraction analysis indicated that a good control of the substitutional nitrogen composition is achieved. The surface morphology of the fabricated samples is investigated by atomic force microscopy (AFM). AFM analysis suggested that optimal growth temperature is obtained for samples grown at 400-420° C. temperature range, with a plasma power lower than 400 W. In other embodiments, the nitrogen plasma source power is in the 150 W-600 W range, or the 200 W-400 W range, or the 250 W-350 W range. FIG. 14 shows the evolution of the surface morphology as a function of growth temperature. The results indicate that an improved morphology (reduced surface roughness) is obtained for samples fabricated at ~420° C., and that a degradation of morphology is observed for samples grown at higher temperatures, that is at about 450° C.

II-3 Absorption Properties and evolution of cut-off wavelengths.

Figure 15:
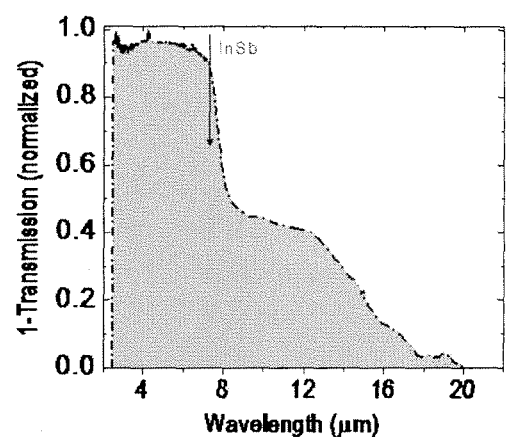
FIG. 15: Room temperature FTIR analysis for an $InSb_{1-x}N_x$ (x~0.01) epilayer on InSb (001) showing a strong absorption below InSb extending to the LWIR range.

Another embodiment of the present invention discloses the absorption properties of an $InN_xSb_{1-x}$ epilayer on InSb at room temperature. FIG. 15 shows the corresponding Fourier transform infrared-red spectroscopy (FTIR) analysis that reveals a strong absorption below InSb extending to the LWIR range.

Figure 16:
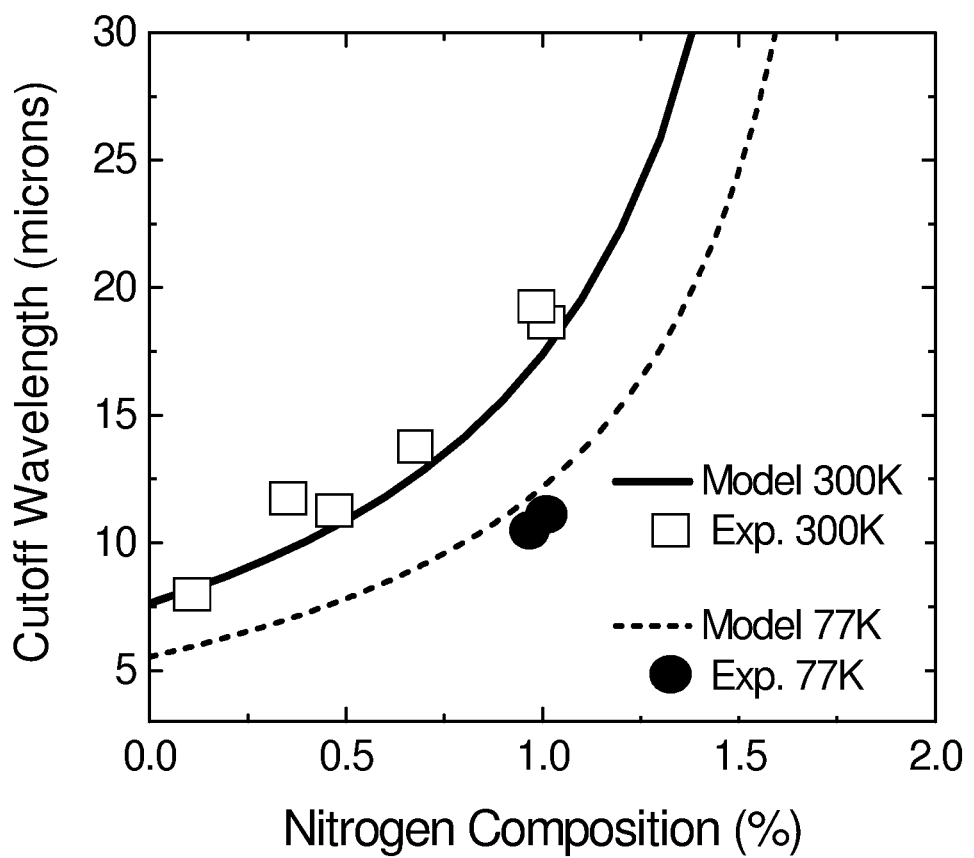
FIG. 16: Evolution of absorption cutt-off wavelength as a function of nitrogen composition $InSb_{1-x}N_x$. Lines represent calculated data and symbols show experimental data.

Another embodiment of the present invention discloses the values of the cut-off wavelength as a function of nitrogen concentration in InSb. FIG. 16 shows experimental data (symbols) and calculated data (line). The evolution of the absorption thresholds (as extracted from FTIR analysis) as a function of the nitrogen substitutional N-composition (as extracted from X-ray analysis) is found to be in good agreement with previous band anti-crossing 10 band k.p calculations described above, showing the possibility for the MBE synthesis of epitaxially strained $InN_xSb_{1-x}$ layers with cutoff wavelengths in the much sought-after 8-14 micron LWIR range.

II-4 Section 2 Conclusion

The development of $InN_xSb_{1-x}$ pseudmorphically strained epilayers on InSb (100) substrates by rf-plasma assisted molecular beam epitaxy technique is investigated and a methodology to obtain high quality epilayers is identified. Analysis of the cut-off wavelength by FTIR demonstrates their suitability for LWIR applications and the experimental data validates the theoretical projections and methodology presented in Part I above.

While the invention described here specifically focuses on a novel method, synthesis and process for the fabrication of a new class of materials that are particularly well adapted to long wavelength infrared devices, one of ordinary skills in the art, with the benefit of this disclosure, would recognize the extension of the approach to other material systems.

The present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee.

REFERENCES CITED

The following references, to the extent that they provide exemplary procedural or other details supplementary to those set forth herein, are specifically incorporated herein by reference.

[1] W. O. Groves, A. H. Herzog, and M. G. Craford, Appl. Phys. Lett. 19, 184 (1971).

[2] M. Weyers, M. Sato and H. Ando, Jpn. J. Appl. Phys. 31, L853 (1992). J. N. Baillargeon et. al. Appl. Phys. Lett. 60 2540, (1992).

[3] M. Kondow, K. Uomi, A. Niwa, T. Kitatani, S. Watahiki and Y. Yazawa, Jpn. J. Appl. Phys. 35, 1273 (1996).

[4] M.-A. Pinault, A. Freundlich, J. A. H. Coaquira, and A. Fotkatzikis, J. Appl. Phys. 98, 023522 (2005).

[5] J. A. H. Coaquira, L. Bhusal, W. Zhu, A. Fotkatzikis, M-A Pinault, A. P. Litvinchuk, and A. Freundlich, Mater. Res. Soc. Symp. Proc. 829, B11.3, (2005).

[6] J. A. H. Coaquira, M-A Pinault, A. P. Litvinchuk, L. Bhusal, and A. Freundlich, J. Appl. Phys.

[7] S. R. Kurtz, A. A. Allerman, E. D. Jones, J. M. Gee, J. J. Banas, and B. E. Hammons, Appl. Phys. Lett. 74, 729 (1999).

[8] A. Wagner, C. Ellmers, F. Hohnsdorf, J. Koch, C. Agert, S. Leu, M. Hofmann, W. Stolz, and W. W. Ruhle, Appl. Phys. Lett. 76, 271 (2000).

[9] E-M. Pavelescu, C. S. Peng, T. Jouhti, J. Konttinen, W. Li, M. Pessa, M. Dumitrescu and S. Spanulescu, Appl. Phys. Lett. 80, 3054 (2002).

[10] W. Li, T. Jouhti, C. S. Peng, J. Konttinen, P. Laukkanen, E-M Pavelescu, M. Dumitrescu, and M. Pessa, Appl. Phys. Lett. 79, 3386 (2001).

[11] L. Bhusal, A Alemu and A Freundlich, Phys. Rev. B 72, 073309, (2005).

[12] A. Freundlich, A. Fotkatzikis, L. Bhusal, L. Williams, W. Zhu, A. Alemu, J. A. H. Coaquira, A. Feltrin and G. Radhakrishnan. J. Vac. Sci. Technol. B 25, 987 (2007)

[13] W. Shan, W. Walukiewicz, J. W. Ager III, E. E. Haller, J. F. Geisz, D. J. Friedman, J. M. Olson, and S R. Kurtz, Phys. Rev. Lett. 82, 1221 (1999).

[14] L. Bhusal and A. Freundlich, Phys. Rev. B 75, 073101 (2007).

[15] L. Bhusal and A. Freundlich, J. Appl. Phys. 102, 074907 (2007)

[16] T. D. Veal, 1. Mahboob, and C. F. McConville. Phys. Rev. Lett. 92, 136801 (2004)

[17] L. Bhusal and A. Freundlich, Appl. Surface Science 255, 703-705 (2008)

[18] S. Tomic, E. P. O'Reilly, P. J. Klar, H. Gruning. W. Heimbrodt, W. M. Chen and I. A. Buvanova, Phys. Rev. B 69, 245305 (2004).

[19] R. J. Elliot, Phys. Rev. 108, 1384 (1957)

[20] A. R. Beattie and P. T. Landsberg. *Proc. R. Soc. London Ser. A.* 249, 16 (1959)

[21] A. Fotkatzikis, M.-A. Pinault, and A. Freundlich, Appl. Phys. Lett. 85, 2478 (2004).

What is claimed:

1. A long wavelength infrared sensor material comprising:
a dilute nitrogen alloy of $InN_xSb_{1-x}$ epilayers strained to an InSb epitaxial substrate;
wherein the infrared sensor material was fabricated using a substrate temperature in a range of about 400° C. to 420° C., a nitrogen plasma source power in a range of about 250-350 W, and a ratio of In flux to Sb flux in the range of about 1 to 2;
wherein the nitrogen composition in the alloy is in a range of about 0.2% to 1.5%;
wherein the infrared sensor material exhibits reduced surface roughness and improved crystalline quality compared with a comparative sensor material fabricated at a same nitrogen plasma source power in a range of about 250-350 W and a same ratio of In flux to Sb flux in a range of about 1 to 2 and at a lower temperature below 400° C.;
wherein the infrared sensor material has a cut-off wavelength in a range of 8-14 μm; and
wherein an X-ray diffraction (XRD) of the infrared sensor material shows a peak with full-width at half maximum (FWHM) of about 40 arcsec.

2. The long wavelength infrared sensor material of claim 1, wherein an near band-edge absorption coefficient of the infrared sensor material is stronger than an absorption coefficient of HgCdTe with identical bandgap.

3. The long wavelength infrared sensor material of claim 1, wherein an Auger recombination lifetime of the infrared sensor material is higher than an Auger recombination lifetime of HgCdTe with identical bandgap.

* * * * *